Figure 1:
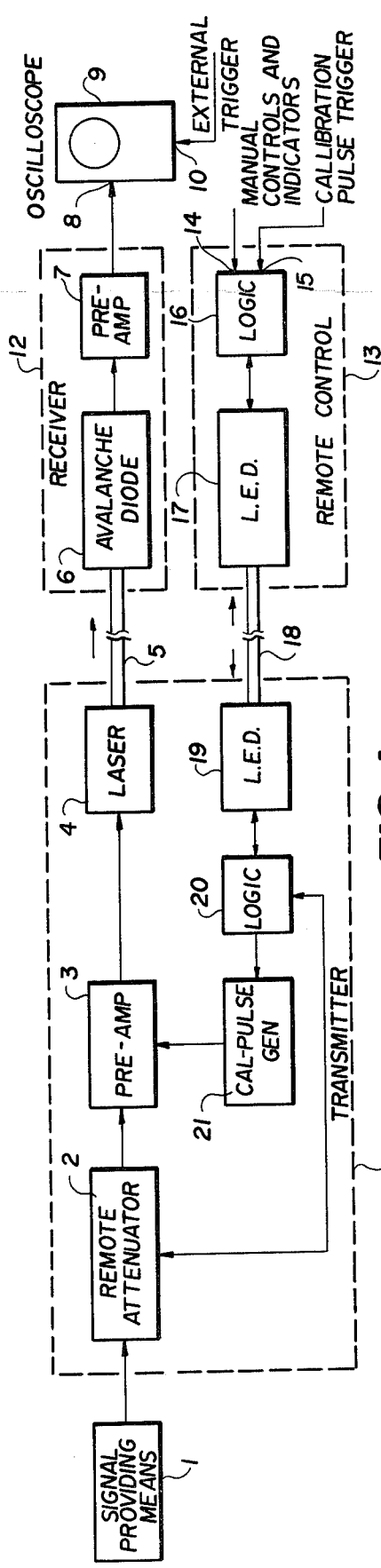

United States Patent [19]

Gilbert

[11] 4,219,762
[45] Aug. 26, 1980

[54] WIDEBAND SELF-CALIBRATED FIBER-OPTIC DATA LINK WITH FIBER-OPTIC STORAGE

[76] Inventor: Raine M. Gilbert, 15013 Olddale Rd., Centreville, Va. 22020

[21] Appl. No.: 6,829

[22] Filed: Jan. 26, 1979

[51] Int. Cl.² .................... H01J 29/70; H01J 29/72
[52] U.S. Cl. ............................. 315/364; 324/121 R
[58] Field of Search .................. 315/364, 391, 392; 324/121 R

[56] References Cited

U.S. PATENT DOCUMENTS 3,656,053  4/1972  Richman .................. 324/121 R

Primary Examiner—Theodore M. Blum
Attorney, Agent, or Firm—Nathan Edelberg; Robert P. Gibson; Saul Elbaum

[57] ABSTRACT

A fiber optic data link apparatus for providing a calibration pulse a short time interval ahead of high frequency signal data to be recorded on a recording device. An apparatus for improving the delay scheme of state of the art oscilloscopes, which results in improved signal fidelity and the availability of longer delay times.

8 Claims, 3 Drawing Figures

WIDEBAND SELF-CALIBRATED FIBER-OPTIC DATA LINK WITH FIBER-OPTIC STORAGE

RIGHTS OF THE GOVERNMENT

The invention described herein may be manufactured, used, and licensed by or for the United States Government for governmental purposes without the payment to me of any royalty thereon.

The present invention is directed to a fiber optic link apparatus for providing a calibration pulse a short time interval ahead of high frequency signal data which is to be viewed on an oscilloscope, so that both the calibration pulse and the signal appear in the same frame. It is further directed to improving the internal delay schemes of wide-band oscilloscopes by providing an optical delay instead of the hard-wire internal delay conventionally used in oscilloscopes, which results in improved signal fidelity of the displayed signal and additionally increases the delay times available.

Fiber optic links for transmitting very fast signal data (order of nanoseconds) are known, and typically these links convert the electrical signal to light by means of a laser transducer, transmit the signal in the form of light the required distance over fiber optic transmission lines, and re-convert the signal to electrical form at its destination. When measuring the signal, for instance on an oscilloscope, it is common to provide an electrical calibration pulse of known magnitude which is sent through the same fiber optic link as the signal and is also displayed on the oscilloscope. This is necessary since the optic link introduces an unknown change in magnitude in the signal, and since the magnitude of the calibration pulse is known, by comparison with it as displayed on the oscilloscope, the magnitude of the signal pulse may be determined.

However, in prior art calibration arrangements, the calibration pulse and the signal pulse have been fed through the fiber optic link and displayed on the oscilloscope at different times, seconds or minutes apart, and this has led to a lack of accuracy, since the transfer characteristic of the fiber optic link, which contains such components as a laser and a light-responsive diode, may change very rapidly as a function of time due to changes in ambient conditions, instantaneous internal conditions of components, etc.

It is therefore an object of the invention to provide an apparatus which provides a calibration pulse immediately ahead of the signal data so that both traverse the fiber optic link at essentially the same time, and so that both may be displayed on an oscilloscope at the same time.

It is a further object of the invention to provide an improved signal delay arrangement for a wide-band oscilloscope.

It is still a further object of the invention to accomplish all of the above objects without a loss in signal fidelity, and without the use of a hard-wire delay means.

The above objects are accomplished by storing the signal, after conversion to optical form in an optical delay means, and generating an electrical calibration pulse, which after conversion to optical form is arranged to be presented at the output of the optical delay a predetermined short time interval ahead of the signal, whereupon a composite signal comprised of the calibration pulse followed by the signal is formed which is fed to the oscilloscope. In one embodiment the calibration signal is internally generated, that is, initiated by a part of the optical signals, and in another embodiment the calibration signal is externally generated. In both embodiments, a trigger signal for the sweep of the oscilloscope is developed, and is arranged to begin the sweep at the instant of time that the composite signal arrives at the signal input of the oscilloscope.

Figure 2:
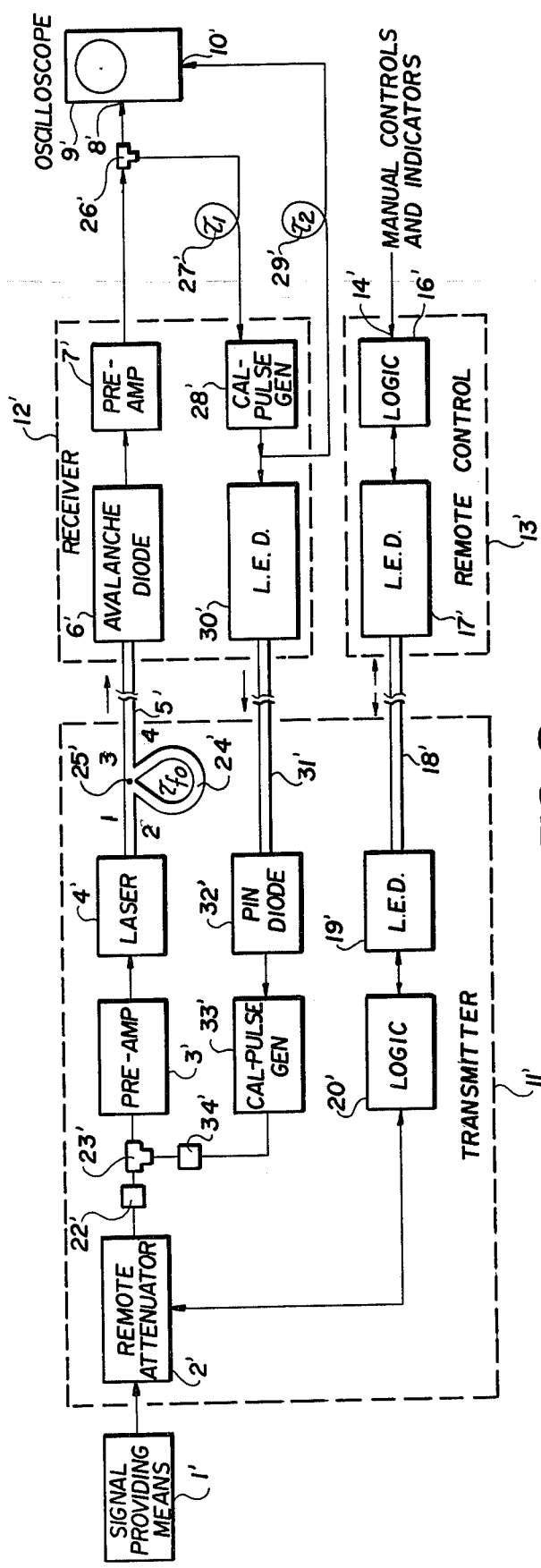

The invention will be better understood by referring to the accompanying drawings, in which, FIG. 1 is a block diagram of a prior art fiber optic link apparatus, FIG. 2 is a block diagram of a first embodiment of the present invention.

Figure 3:
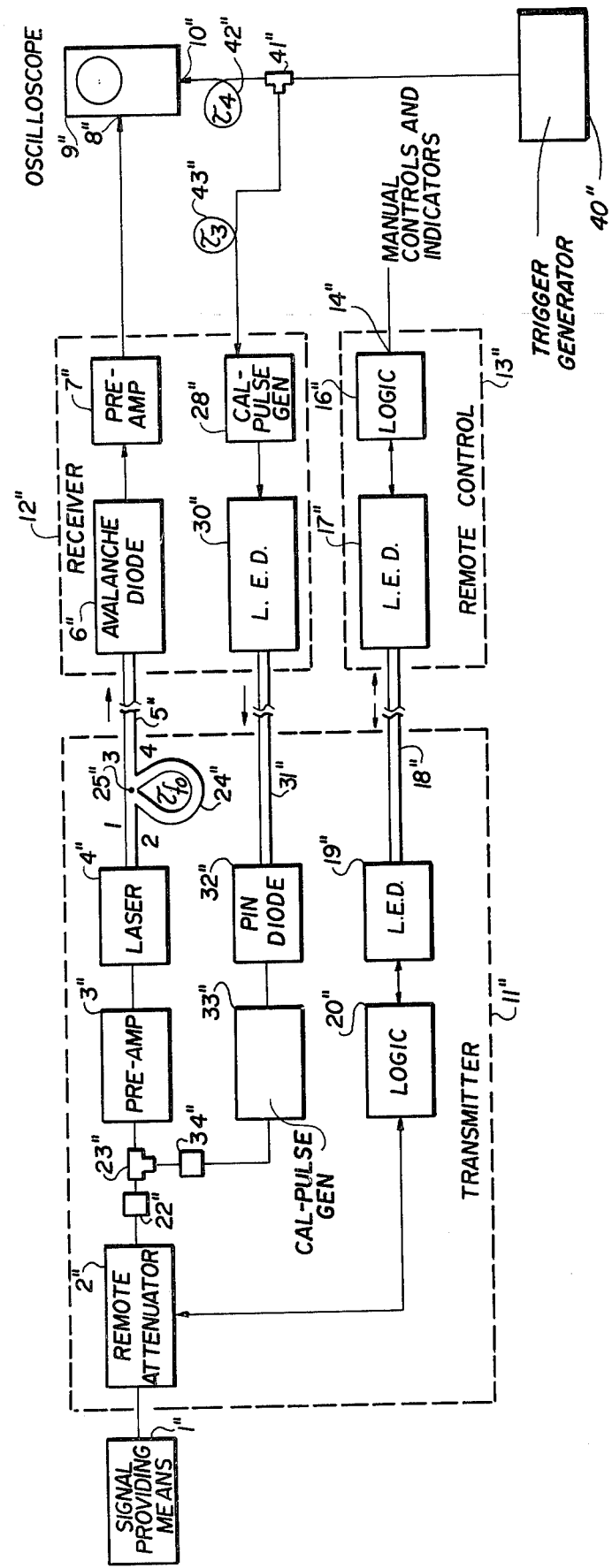

FIG. 3 is a block diagram of a second embodiment of the present invention.

FIG. 1 is a block diagram of a prior art wideband fiber optic analog data link. It is used to transmit and display very fast signal data (signals which start and stop within a number of nanoseconds), the electrical signal data being converted into optical form and then being transmitted over fiber optic cable, which allows relatively distortionless transmission, unlike if the electrical data signal were merely transmitted over an electrical transmission line.

Referring to FIG. 1, the electrical signal to be transmitted and displayed is provided by signal providing means 1, which may be any means which provides a very fast data signal. This signal is fed to remote attenuator 2 of transmitter 11, and then to the preamplifier 3, which drives laser 4. Laser 4 converts the data signal into a corresponding optical signal, which is transmitted along light transmitting pipe 5 to the receiver 12 which is at the same location as oscilloscope 9, on which the data is to be displayed. The optical signal is inputted to avalanche diode 6 which re-converts it to a corresponding electrical signal, which is fed to preamplifier 7, and then to the signal input 8 of wideband oscilloscope 9, which displays the signal.

Since the optic link introduces an unknown amplitude change to the electrical signal data, the actual amplitude of the signal displayed on oscilloscope 9 is not known. To determine this amplitude, a matter of seconds or minutes before or after the data signal is sent through the optic link and displayed, a calibration pulse, the amplitude of which is precisely known, is fed through the same optic link and displayed on the oscilloscope. A comparison of the relative amplitudes of the calibration pulse and the signal pulse as displayed makes it possible to compute the actual value of the displayed data signal. The calibration pulse is generated by calibration pulse generator 21 and is fed to the input of preamplifier 3, where it is amplified and then fed through the same optic link as the data signal traversed. Calibration pulse generator 21 is activated to generate the calibration pulse by a calibration pulse trigger signal which an operator causes to be generated at logic 16 of remote control unit 13. The signal generated by logic 16 is fed to light emitting diode 17, which generates a corresponding optical signal which is fed across light pipe 18 to light emitting diode 19. Since in the arrangement shown in FIG. 1, light signals are transmitted in both directions across light pipe 18, light emitting diodes 17 and 19 are each alternatingly used as light producing and as light responsive devices. As known to those skilled in the art, a light emitting diode, when biased properly, may be utilized as a light responsive diode. Thus, the light signal generated by light emitting diode 17 is re-converted to an electrical signal by light emitting diode 19, and from there it is fed to logic 20 and to calibration pulse generator 21, which generates the calibration pulse.

Means is also provided at remote control unit 13 for setting the attenuation level of resistive remote attenuator 2. The resistance of this attenuator is controlled by setting appropriate manual controls at input 14 of logic 16, which control values are converted to an appropriate code or set of signals by logic 16, which signals are sent across light pipe 18, and decoded by logic 20 which is effective to set the appropriate resistance of attenuator 2. Further, means may be provided for communicating the value of resistance set by attenuator 2 back through logic 20, across light pipe 18 from left to right in the Figure, and back to logic 16, which is effective to cause appropriate indicators to read out the value which has actually been set in remote attenuator 2. By this technique, the operator may check to see that the value which is inserted into the system by the manual controls, was actually set in the remote attenuator 2. Since the attenuation introduced by the remote attenuator 2 is known, and since the calibration pulse and the signal traverse exactly the same components except for attentuator 2, the value of the signal data may be precisely calculated. It is to be understood that the structure and function of remote control unit 13 and of logic 20 and remote attenuator 2 is known to those skilled in the art, and forms no part of the present invention.

The problem with the prior art calibration technique illustrated in FIG. 1 is that the gain of the optical path, especially of laser 4, may drift, so that there is no guarantee that the calibration pulse, which is sent through the optic path a matter of seconds or minutes before or after the signal data, traverses a path having the same gain as the signal. This deficiency is remedied by the present invention, which provides apparatuses which arrange the calibration pulse to be input to the light pipe 5 only a matter of nanoseconds ahead of the signal, so that both the calibration pulse and signal traverse the optic path at essentially the same time and are displayed on the oscilloscope in the same frame.

FIG. 2 is a block diagram of a first embodiment of the invention, and it should be noted that corresponding components in the three figures are marked with corresponding numerals. Referring to FIG. 2, signal providing means 1' provides the fast signal data of interest, which is fed through remote attenuator 2', isolation attenuator 22', and matched tee 23'. At matched tee 23', the signal is divided in half, and the half which is directed toward calibration pulse generator 33' is absorbed in isolation attenuator 34' and the matched impedance of the calibration pulse generator. If desired, a directional coupler could be used instead of the matched tee and second isolation attenuator. The other half of the data signal is fed to preamplifier 3' and laser 4', which converts the signal to a corresponding light signal.

The light signal is fed to fiber optic store 24' which delays a portion of the signal. Fiber optic store 24' is a four-branch star coupler having a junction 25' at which the light divides into the different paths. The arrangement shown provides one undelayed path (directly from 1 to 4) for the optic signal, and a delayed path (either 1, 2, 3, 4, or 1, 3, 2, 4, which are equal in length).

The amount of the delay $\tau_{fo}$ introduced by the fiber optic loop is determined by the length of the loop. The type of fiber optic cable chosen must be sufficiently nondispersive to preserve the desired system bandwidth, and at the present state of the art this is nominally 600 MHz. Some fiber optic waveguides which are commercially available have dispersion ratings equal or less than 1 nanosecond per kilometer, so that delays of more than 1500 nanoseconds can be achieved without significant degradation of the system's nominal bandwidth.

The non-delayed portion of the light signal is transmitted over light pipe 5' to avalanche diode 6' at the receiver 12' where it is re-converted to an electrical signal. It is then fed to preamplifier 7' and out of the receiver to matched tee 26' where the signal divides, half going into the matched termination of the recording device and the other half being fed to hardware delay 27'. The part of the signal fed to the recording device is absorbed without record since no trigger for the device is available as of this time. The part of the signal fed to delay 27' is delayed by time $\tau_1$, and is then fed to calibration pulse trigger generator 28' which generates a square pulse upon receiving the signal from delay 27'. The pulse output of trigger generator 28' is used to activate light emitting diode 30', which generates a light signal which is transmitted across light pipe 31' to a light responsive device 32', preferably a PIN diode. The output of the diode activates calibration pulse generator 33', which may generate a bipolar square pulse. This calibration pulse passes through isolation attenuator 34' and is divided in half at matched tee 23'. The half directed towards the signal source passes through isolation attenuator 22', and is absorbed and forgotten. The other half proceeds to the right through the same laser preamplifier circuitry, the same laser 4', and the same interface between the laser and the fiber optic cable as the data signal did earlier. This calibration pulse likewise divides itself between the delayed and non-delayed light paths at the four-branch star coupler 24'. This time the portion of the calibration pulse directed along the short path 1 to 4 is the important portion, because the delay times $\tau_{fo}$ and $\tau_1$ are selected so that the undelayed half of the calibration pulse passes the star coupler junction the desired number of nanoseconds ahead of the re-emergence of the late or stored half of the data signal. For instance, a typical desired interval between the calibration pulse and the data signal would be about 10 nanoseconds, and it is thus seen that the desired reversal of the calibration and data signal time sequence has been achieved. Thus, a composite signal comprised of the calibration pulse followed by the data signal is fed to the oscilloscope and is displayed.

It is desirable to arrange the oscilloscope sweep to begin sweeping just before the instant of time at which the composite signal arrives at input 8' of the oscilloscope's deflection plates. This is accomplished by connecting a hardwire delay 29' of appropriate delay time $\tau_2$ to the output of calibration pulse trigger generator 28', using a matched tee. The output of delay 29' is fed to the sweep trigger input 10' of the oscilloscope and the delay time $\tau_2$ is selected so that the sweep begins the desired number of nanoseconds before the composite signal arrives at the oscilloscope's deflection plates.

While in the embodiment of FIG. 2, the calibration pulse is internally triggered, in the embodiment of FIG. 3, this pulse as well as the sweep trigger signal for the oscilloscope are externally initiated. Referring to FIG. 3, an external trigger generator 40" used to start the experiment provides a trigger signal which is fed to matched tee 41". Half of the external trigger signal is fed to hardwire delay 43" which introduces a delay time $\tau_3$. The output of delay 43" is fed to calibration pulse trigger generator 28" and from there follows the same path as did the signal in the embodiment of FIG. 2, the delay time $\tau_3$ being arranged so that the undelayed part of the calibration pulse is the desired number of nanoseconds ahead of the re-emerging delayed signal pulse at the output of fiber optic store 24". Additionally, the other half of the external trigger signal at matched tee 41" is fed through hardwire delay 42" which introduces a delay time $\tau_4$ to the signal, which is arranged to begin the sweep of the oscilloscope at the desired number of nanoseconds before the composite signal consisting of the calibration pulse and data signal arrives at signal input 8" of the oscilloscope's deflection plates.

The remote control units 13' and 13" in the embodiments of FIGS. 2 and 3 are similar to the unit heretofore described in conjunction with FIG. 1, and as mentioned above, these units form no part of the present invention.

It should be noted that in both of the embodiments, the calibration pulse at the output of the transmitter has followed a different light path than the signal, since the calibration pulse was not delayed by the fiber optic store while the data signal was delayed. If the fiber optics has dispersion, then this may cause some inaccuracy, but may be compensated for by the fact that the relationship between the two routes is completely defined by a comparison of the non-delayed half of the calibration pulse with the stored half of the calibration pulse, which comparison may be made before the apparatus is used for measuring signal data. The information obtained from this comparison may then be used to compensate the results obtained when using the apparatus to measure signal data. To obtain the compensation factor, both the non-delayed half of the calibration pulse and the stored half of the same calibration pulse should be Fourier analyzed and the ratio of amplitudes in the frequency domain is the compensation factor which can then be used to Fourier transform the delayed portion of the signal to the state in which it would have passed through the undelayed route. Of course, if the star coupler and the fiber optic waveguide are of high quality, the transform will approach the identity, or unit transform.

As is mentioned above, the invention is useful not only in providing an automatically calibrated data signal for long-distance dielectric waveguide transmission, but is also directly applicable to improving the internal delay schemes of wideband oscilloscopes. Currently, these oscilloscopes provide a hardwire delay or storage of the signal inside the scope for a time interval nominally equal to the time which is required to sense the presence of the signal, and this response is used to trigger the oscilloscope sweep, a process which normally takes 50 to 100 nanoseconds.

The hardwire delay which is used in the oscilloscope causes high frequency attenuation, and the flat band response of the scope can be restored only with specialized electronic equalizers which are devices which deliberately attenuate the lower Fourier frequencies of the signal by the same amount as the delay cable attenuates the higher Fourier frequencies. The penalty which is inherent in this scheme is loss of amplitude across the entire frequency band of the oscilloscope. To minimize this penalty, scope designers typically build in the bare minimum length of delay cable, so that as the hardware grows older and trigger threshold sensitivity deteriorates, it becomes increasingly difficult for the user to capture the leading edge of a fast rising signal using the internal trigger mode.

By using the present invention, including the optical delay provided thereby instead of the hardwire delay built into the scope, the high frequency attenuation caused by the prior art delay scheme can be eliminated. Additionally, the fiber optic delay provides a relatively large delay capability which is not now possible in the hardwire delays which are used in state of the art oscilloscopes.

Another advantage of this scheme is that it provides complete electrical isolation between the ambient R.F. noise environment outside the oscilloscope and the internal deflectionplate drivers, the latter being inherently R.F.-noise sensitive. With hardwire delivery of signals to these plate drivers, as in the present state-of-the-art oscilloscope, this electrical isolation is not possible.

I wish it to be understood that I do not desire to be limited to the exact details of construction shown and described, for obvious modifications can be made by a person skilled in the art.

I claim:

1. An apparatus for improving the internal delay scheme of a wide band oscilloscope comprising,
   means for providing an electrical signal of interest to be displayed on said oscilloscope,
   means for converting said electrical signal into a corresponding optical signal,
   means for delaying said optical signal for a predetermined period of time,
   means for generating a sweep trigger signal for said oscilloscope which is arranged to begin the sweep of said oscilloscope the desired number of nanoseconds before said delayed optical signal after being re-converted to an electrical signal arrives at the signal input of said oscilloscope's deflection plates,
   means for re-converting said delayed optical signal to an electrical signal and,
   means for inputting said electrical signal to the deflection plate input of said oscilloscope.

2. An apparatus for transmitting a signal of interest over a fiber optic link wherein a composite signal comprised of said signal of interest and a calibration pulse which precedes the signal of interest by a short time interval for display on an oscilloscope if desired, are provided, comprising,
   means for providing an electrical signal of interest,
   means for converting said electrical signal of interest to a corresponding optical signal,
   fiber optic light pipe link means for conveying said optical signal, said light pipe link means including an optical delay means for delaying at least part of said optical signal for a greater delay time than the inherent delay time of a straight fiber optic light pipe, said optical delay means having an output,
   means for generating a trigger signal in time relation to the occurrence of said signal of interest,
   electrical delay means for delaying said trigger signal,
   calibration pulse generator means for generating an electrical calibration pulse responsive to said trigger signal, the delay of said electrical delay means being arranged so that said calibration pulse after being converted to optical form is present at said output of said optical delay means a predetermined short time interval ahead of the time that said delayed portion of said optical signal is present at said output, means for converting said electrical calibration pulse into a corresponding optical calibration pulse, means for converting the composite optical signal comprised of said optical calibration pulse and said optical signal into a corresponding electrical composite signal, and means for feeding said composite electrical signal to the output of the apparatus.

3. The appartus of claim 2 wherein said optical delay means for delaying at least a part of said optical signal comprises means for not delaying a part of said signal, which part passes through said means to said output undelayed and wherein said means for generating a trigger signal in time relation to said signal of interest comprises means for converting said undelayed optical signal to an electrical trigger signal, said undelayed optical signal having have occurred in time relation to said signal of interest.

4. The apparatus of claim 3 further comprising means for developing a sweep trigger signal for triggering the sweep of an oscilloscope, said means for developing also being responsive to said undelayed optical signal and being arranged to delay the occurrence of said sweep trigger signal until said composite signal comprised of said calibration signal and said signal of interest arrives at said apparatus output.

5. The apparatus of claim 2 wherein said means for generating a trigger signal in time relation to said signal of interest comprises an external trigger signal generating means which is externally synchronized to the occurrence of said signal of interest.

6. The apparatus of claim 5 further comprising means for developing an oscilloscope sweep trigger signal from said external trigger signal, said means for developing being arranged to delay the occurrence of said sweep trigger signal until said composite signal comprised of said calibration signal and said signal of interest arrives at said apparatus output.

7. The apparatus of claims 3 or 5 wherein said optical delay means comprises a four branch star coupler having two branches formed from opposite ends of a single length of fiber optical waveguide.

8. The apparatus of claim 7 wherein said means for converting said electrical signals into corresponding optical signals includes a laser means and wherein said means for converting said composite optical signal into a corresponding composite electrical signal comprises an avalanche diode.

* * * * *